United States Patent
Cui et al.

(10) Patent No.: US 10,930,345 B1
(45) Date of Patent: Feb. 23, 2021

(54) VOLTAGE PROFILE FOR REDUCTION OF READ DISTURB IN MEMORY CELLS

(71) Applicant: Micron Technology, Inc., Boise, ID (US)

(72) Inventors: Mingdong Cui, Folsom, CA (US); Hongmei Wang, Boise, ID (US); Michel Ibrahim Ishac, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/660,590

(22) Filed: Oct. 22, 2019

(51) Int. Cl.
*G11C 11/419* (2006.01)
*G11C 13/00* (2006.01)

(52) U.S. Cl.
CPC .......... *G11C 13/004* (2013.01); *G11C 13/003* (2013.01); *G11C 2013/0045* (2013.01); *G11C 2013/0047* (2013.01)

(58) Field of Classification Search
CPC ................................................ G11C 11/419
USPC ........................................................ 365/100
See application file for complete search history.

(56) References Cited

U.S. PATENT DOCUMENTS

| | | | | |
|---|---|---|---|---|
| 5,883,827 | A | * | 3/1999 | Morgan ............. G11C 13/0004 365/100 |
| 2010/0124089 | A1 | * | 5/2010 | Ali .......................... G11C 7/067 365/49.1 |
| 2017/0243659 | A1 | * | 8/2017 | Heinrich-Barna ......................... G11C 16/0433 |
| 2019/0164590 | A1 | * | 5/2019 | Chanana ............. G11C 11/4085 |
| 2019/0244656 | A1 | * | 8/2019 | Li .......................... G11C 11/419 |
| 2020/0090745 | A1 | * | 3/2020 | Gangasani ........... G11C 13/004 |

* cited by examiner

*Primary Examiner* — Min Huang
(74) *Attorney, Agent, or Firm* — Greenberg Traurig

(57) ABSTRACT

An integrated circuit memory device having: a memory cell; a current sensor connected to the memory cell; a voltage driver connected to the memory cell; and a bleed circuit connected to the voltage driver. During an operation to read the memory cell, the voltage driver drives a voltage applied on the memory cell. The bleed circuit is activated to reduce the voltage during a time period in which the current sensor operates to determine whether or not at least a predetermined level of current is presented in the memory cell.

17 Claims, 3 Drawing Sheets

VOLTAGE PROFILE FOR REDUCTION OF READ DISTURB IN MEMORY CELLS

FIELD OF THE TECHNOLOGY

At least some embodiments disclosed herein relate to voltage drivers for applying voltages to memory cells in general and more particularly, but not limited to, voltage profiles to reduce read disturb in memory cells during read operations.

BACKGROUND

A memory integrated circuit can have one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a phase-change memory device and a select device that are stacked together as a column in an integrated circuit. Memory cells of such columns are connected in the integrated circuit via two layers of wires running in directions that are perpendicular to each other. One of the two layers is above the memory cells; and the other layer is below the memory element columns. Thus, each memory cell can be individually selected at a cross point of one wire on each of the two layers. Cross point memory devices are fast and non-volatile and can be used as a unified memory pool for processing and storage.

A non-volatile integrated circuit memory cell can be programmed to store data by applying one voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determine whether the memory cell becomes conductive at a voltage corresponding to a pre-defined state.

The voltage(s) applied to read a memory cell in an integrated circuit can disturb the state of the memory cell and/or nearby memory cells in the integrated circuit. The read disturb effect can cause errors in retrieving data from the nearby memory cells.

BRIEF DESCRIPTION OF THE DRAWINGS

The embodiments are illustrated by way of example and not limitation in the figures of the accompanying drawings in which like references indicate similar elements.

DETAILED DESCRIPTION

At least some embodiments disclosed herein provide systems, methods and apparatus to reduce read disturb in non-volatile integrated circuit memory.

In some implementations, cross point memory can use a memory cell that has a select device but no phase-change memory device. For example, the memory cell can be a single piece of alloy with variable threshold capability. The read/write operations of such a cell can be based on thresholding the cell while inhibiting other cells in subthreshold bias, in a way similar to the read/write operations for a memory cell having a select device and a phase-change memory device that are stacked together as a column.

Such a memory cell, having a select device but no phase-change memory device, can be programmed in cross point memory to have a threshold voltage window. The threshold voltage window can be created by applying programming pulses with opposite polarity to the select device. For example, the select device can be biased to have a positive voltage difference between two sides of the select device and alternatively, to have a negative voltage difference between the same two sides of the select device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to become conductive while a reset cell remains non-conductive.

The voltage stress applied on a reset cell (e.g., a cell having a high threshold) in a time period to determine whether or not the cell is conductive can reduce the voltage threshold of the reset cell. When the voltage threshold is sufficiently reduced after multiple read operations, the cell can become conductive during the read operation, which can lead an incorrect read of the state of the cell.

To reduce the read disturb caused by the voltage stress, the voltage profile for the read operation can be adjusted (e.g., via a bleed circuit) to reduce the voltage applied on the reset cell during the sensing of whether or not the cell is conductive, as further discussed below.

Figure 1:
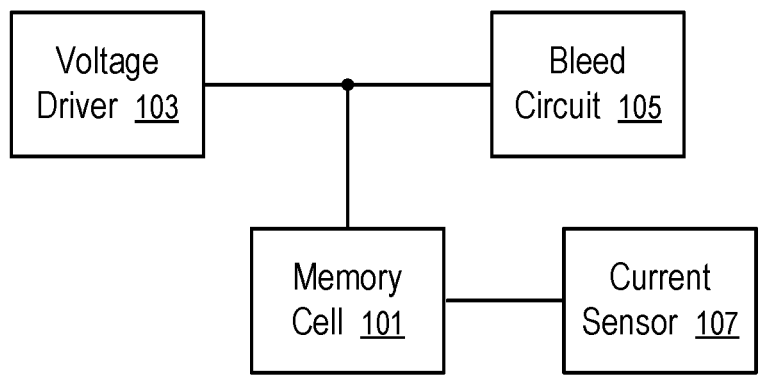
FIG. 1 shows the use of a bleed circuit to alter a voltage profile driven by a voltage driver in reading a memory cell according to some embodiments.

FIG. 1 shows the use of a bleed circuit (105) to alter a voltage profile driven by a voltage driver (103) in reading a memory cell (101) according to some embodiments.

In FIG. 1, the voltage driver (103) is configured to drive up the voltage applied on the memory cell (101) during a read operation. After the voltage applied on the memory cell (101) is above the threshold voltage of a programmed cell, the current sensor (107) is configured to determine whether or not the memory cell (101) is conductive, based on the current going through the memory cell (101). If the current sensor (107) detects an amount of current corresponding to a programmed cell, the memory cell (101) is determined to have been programmed to have a low voltage threshold corresponding to data that is different from the data represented by a reset cell that has a high voltage threshold. If the current sensor (107) does not detect the amount of current corresponding to a programmed cell, the memory cell is determined to be a reset cell that corresponds to predetermined data represented by having high voltage thresholds (e.g., cells that have not yet been programmed after a reset or erase operation, or cells that have been programmed to have a high voltage threshold).

To reduce read disturb, the bleed circuit (105) is activated during and/or after a current sensing time period in which the current sensor (107) operates to detect whether an amount of current corresponding to a programmed cell is present in the memory cell (101). The bleed circuit (105) reduces the voltage applied on the memory cell (101) during the current sensing period. The reduction of the voltage caused by the bleed circuit (105) can be limited to avoid interfering with the current to be sensed by the current sensor (107).

Figure 2:
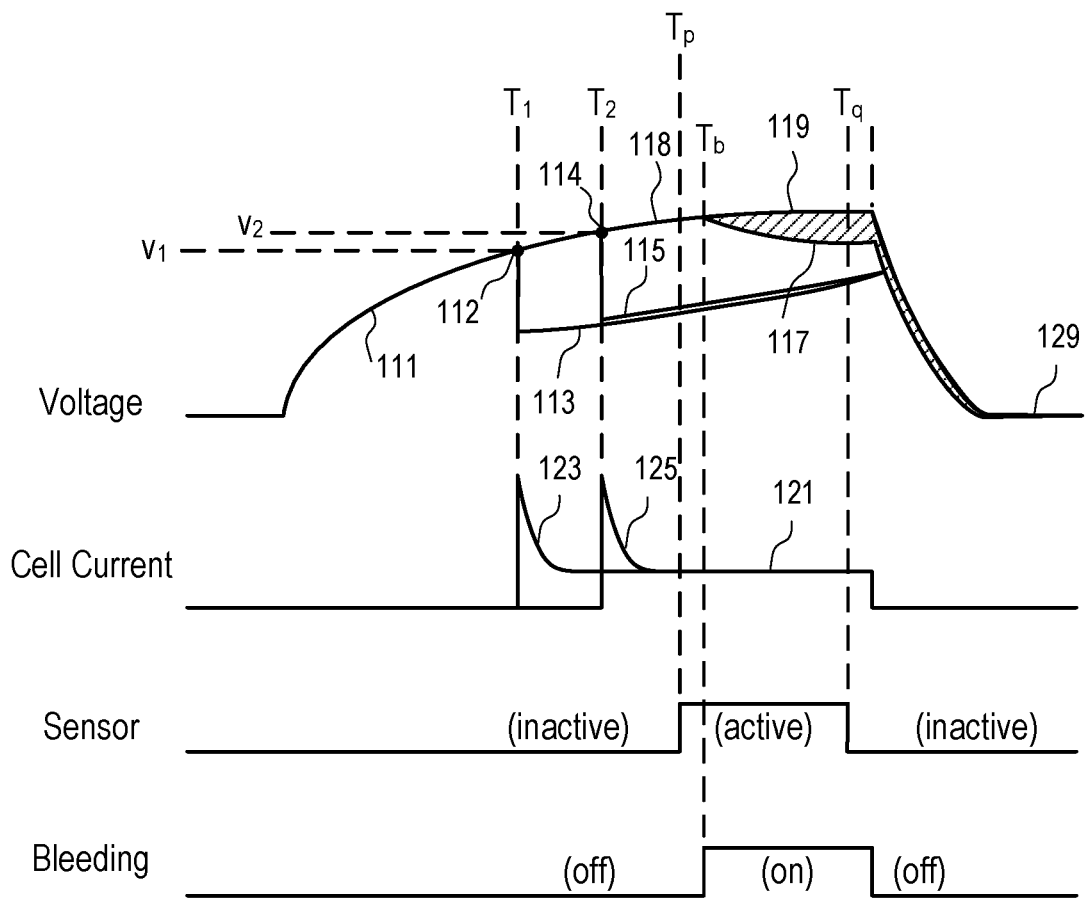
FIG. 2 shows a voltage profile adjusted by a bleed circuit to reduce read disturb according to one embodiment.

For example, the reduction of the voltage applied by the voltage driver (103) on the memory cell (101) can have a profile illustrated in FIG. 2.

FIG. 2 shows a voltage profile (117) adjusted by a bleed circuit (105) to reduce read disturb according to one embodiment.

During the read operation, the voltage driver (103) drives up the voltage (111) applied on the memory cell (101).

When the memory cell (101) is programmed and has a threshold voltage of v1 (112), the memory cell (101) becomes conductive after time instance T1; the voltage applied by the voltage driver (103) is reduced to follow the voltage curve (113); and the current through the memory cell (101) follows the transient current curve (123) to the stable current curve (121).

Similarly, when the memory cell (101) is programmed and has a threshold voltage of v2 (114), the memory cell (101) becomes conductive after time instance T2; the voltage applied by the voltage driver (103) is reduced to follow the voltage curve (115); and the current through the memory cell (101) follows the transient current curve (125) to the stable current curve (121).

However, if the memory cell (101) has been reset and has not yet been programmed after being reset (or has been programmed to have a high threshold), the level of the current (121) is not present in the memory cell (101); and the voltage applied by the voltage driver (103) continue to rise following the voltage curve (118).

If the bleed circuit (105) is absent, the voltage driver (103) can further drive up the voltage (119) applied on the memory cell (101) that has been reset (or programmed to have a high threshold).

The bleed circuit (105) is configured to be optionally activated at least during the time period between Tp and Tq in which the current sensor (107) is configured to determine whether or not the level of cell current (121) is present in the memory cell (101). Once the current sensor (107) is activated at Tp, the current through the current sensor (107) is sampled and held before the bleed circuit (105) is activated. When the bleed circuit (105) is activated, the voltage (117) applied by the voltage driver (103) is reduced from the voltage (119). The reduction of the voltage stress corresponds to the shaded area between the voltage curve (119) and the voltage curve (117). The voltage stress reduction is a function of the duration of the reduced voltage and the magnitude of the voltage reduction. Thus, the operation of the bleed circuit (105) can significantly reduce read disturb for the memory cell (101) (and nearby memory cells) by adjusting/depressing the voltage from the profile (119) to the profile (117). At least some aspects of the operations of the bleed circuit (105) can controlled via microcode. Thus, the use and/or timing of the bleed circuit (105) can be selectively adjusted.

The bleed circuit (105) can be implemented via a current mirror, or via a capacitor and a switch circuit which when activated causes the voltage driven by the voltage driver (103) to leak via the capacitor. The activation and the deactivation of the switch circuit can be controlled according to the timing corresponding to the activation/deactivation of the operation of the current sensor (107) and/or the timing of the read operation. For example, when the current sensor (107) is inactive, the switch circuit is deactivated (e.g., turned off); and after the current sensor (107) is active in sensing the current going through the memory cell (101), the switch circuit is activated (e.g., turned on) to reduce/depress the voltage profile (e.g., from 119 to 117).

For example, voltage bleeding caused by the bleed circuit (105) can be initiated at time Tb after time Tp when the current sensor (107) starts to determine whether or not the level of current (121) is present in the memory cell (101). Time Tp and time Tb can be configured to follow time T2 when a programmed cell would become conductive and thus have reduced voltage (115).

Optionally, voltage bleeding caused by the bleed circuit (105) can continue after time Tq when the current sensor (107) completes its operations of determining whether the level of current (121) is present in the memory cell (101). For example, the bleeding can continue in accelerating the reduction of the voltage to a predetermined level (129) that corresponds to the end of the read operation.

In general, the technique discussed above reduces read disturb by reducing (e.g., using a bleed circuit) the voltage during current sensing and preventing the voltage from further rising during current sensing. The technique can be used not only for memory cells that has no phase-change memory device in cross point memory but also for other types of integrated circuit memory cells, such as memory cells having phase-change memory device in cross point memory, memory cells having transistors, flash memory cells (e.g., NAND memory or NOR memory), etc.

Figure 3:
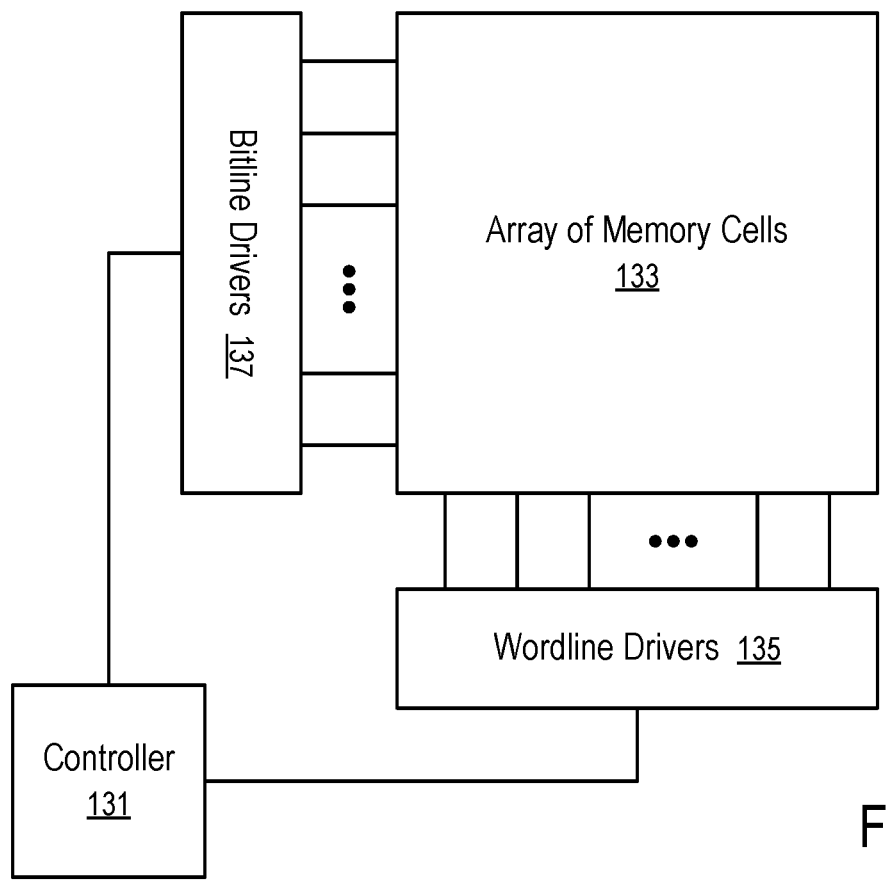
FIG. 3 shows a memory device configured with drivers to implement voltage profiles for reduced read disturb according to one embodiment.

FIG. 3 shows a memory device configured with drivers to implement voltage profiles for reduced read disturb according to one embodiment.

In FIG. 3, the memory device includes an array (133) of memory cells. For example, a memory cell (101) illustrated in FIG. 1 can be used in the memory cell array (133).

The memory device of FIG. 3 includes a controller (131) that operates bitline drivers (137) and wordline drivers (135) to access the individual memory cells (e.g., 101) in the array (133).

The bitline drivers (137) and/or the wordline drivers (135) can include a voltage driver (103) having a bleed circuit (105) illustrated in FIG. 1 to reduce voltage profile during current sensing operation of a current sensor (107).

Figure 4:
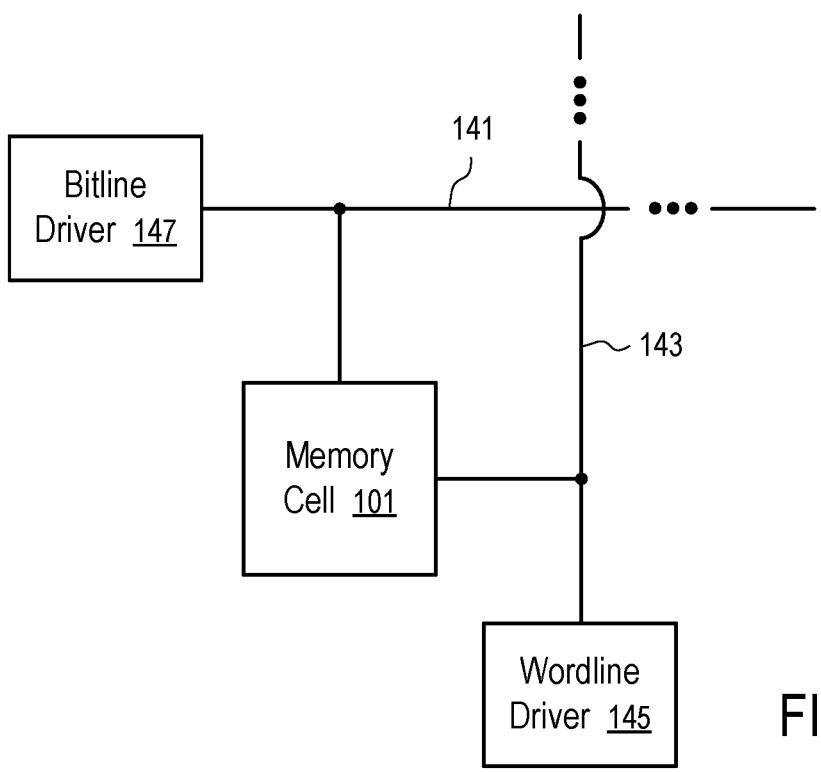
FIG. 4 shows a memory cell with a bitline driver and a wordline driver configured to implement voltage profiles for reduced disturb according to one embodiment.

For example, each memory cell (e.g., 101) in the array (133) can be accessed via voltages driven by a pair of a bitline driver and a wordline driver, as illustrated in FIG. 4.

FIG. 4 shows a memory cell (101) with a bitline driver (147) and a wordline driver (145) configured to implement voltage profiles for reduced disturb according to one embodiment.

For example, the bitline driver (147) drives a first voltage applied to a row of memory cells in the array (133); and the wordline driver (145) drives a second voltage applied to a column of memory cells in the array (133). A memory cell (101) in the row and column of the memory cell array (133) is subjected to the voltage difference between the first voltage driven by the bitline driver (147) and the second voltage driven by the wordline driver (145). When the first voltage is higher than the second voltage, the memory cell (101) is subjected to one voltage polarity (e.g., positive polarity); and when the first voltage is lower than the second voltage, the memory cell (101) is subjected to an opposite voltage polarity (e.g., negative polarity).

At least one of the bitline driver (147) and the wordline driver (145) can include a bleed circuit (e.g., 105) to reduce the voltage profile (e.g., from 119 to 117) to reduce read disturb.

For example, when the memory cell (101) is configured to be read with positive voltage polarity, the bitline driver (147) can be configured to drive a positive voltage with increasing magnitude. During the sensing of the current in the memory cell (101), a bleed circuit (e.g., 105) associated with the voltage driver (e.g., 103) of the bitline driver (147) can be activated to depress the voltage from the profile (119) to the profile (117) illustrated in FIG. 2 for the reset memory cell (101).

For example, when the memory cell (101) is configured to be read with negative voltage polarity, the wordline driver (145) can be configured to drive a positive voltage with increasing magnitude. During the sensing of the current in the memory cell (101), a bleed circuit (e.g., 105) associated with the voltage driver (e.g., 103) of the wordline driver (145) can be activated to depress the voltage from the profile (119) to the profile (117) illustrated in FIG. 2 when the memory cell (101) has been reset but has not yet been programmed to have a reduced threshold voltage (or have been programmed to have a high threshold voltages).

Optionally, during the read operation, both the bitline driver (147) and the wordline driver (145) can drive voltages of increasing magnitude. For example, the bitline driver (147) can be configured to drive a positive voltage with increasing magnitude; and the wordline driver (145) can be configured to drive a negative voltage with increasing magnitude. The difference between the voltage driven by the bitline driver (147) and the voltage driven the wordline driver (145) corresponds to the voltage applied on the memory cell (101). During the sensing of the current in the memory cell (101), bleed circuits (e.g., 105) associated with the voltage drivers (e.g., 103) of the wordline driver (145) and the bitline driver (147) can be activated to reduce the magnitudes of the voltages driven by the wordline driver (145) and the bitline driver (147) and thus depress the voltage from the profile (119) to the profile (117) illustrated in FIG. 2.

For example, the bitline drivers (137) can be used to drive parallel wires (e.g., 141) arranged in one direction and disposed in one layer of cross point memory; and the wordline drivers (135) can be used to drive parallel wires (e.g., 143) arranged in another direction and disposed in another layer of the cross point memory. The wires (e.g., 141) connected to the bitline drivers (e.g., 147) and the wires (e.g., 143) connected to the wordline drivers (e.g., 145) run in the two layers in orthogonal directions. The memory cell array (133) is sandwiched between the two layers of wires; and a memory cell (e.g., 101) in the array (133) is formed at a cross point of the two wires (e.g., 141 and 143) in the integrated circuit die of the cross point memory.

Figure 5:
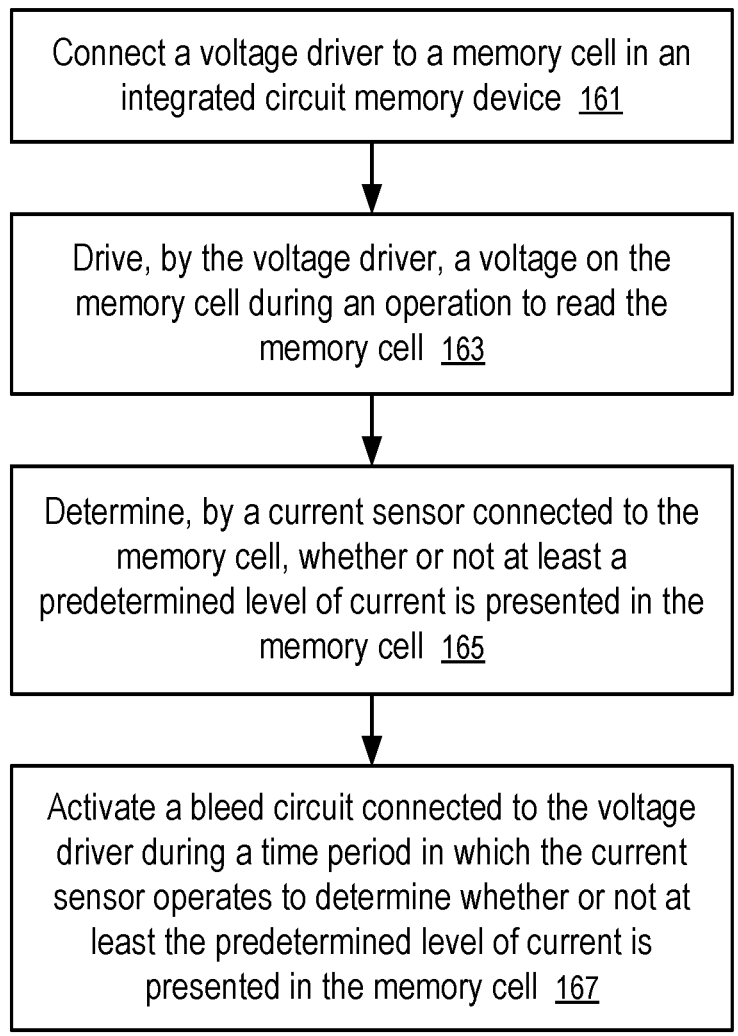
FIG. 5 shows a method to apply a read voltage on a memory cell according to one embodiment.

FIG. 5 shows a method to apply a read voltage on a memory cell according to one embodiment. For example, the method of FIG. 5 can be implemented in a memory device of FIG. 3 for a voltage profile (117) illustrated in FIG. 2 using a voltage driver (103) with a bleed circuit (105) of FIG. 1.

At block 161, a voltage driver (103) is connected to a memory cell (101) in an integrated a circuit memory device (133).

For example, the integrated a circuit memory device (133) can include cross point memory containing the memory cell (101). For example, the memory cell (101) can include a select device but no phase-change memory device; and the memory cell (101) is programmable to store data via applying pulses with opposite polarity. During the operation to read the memory cell, the voltage driver (103) drives the voltage according to a predetermined, fixed polarity.

At block 163, the voltage driver (103) drives a voltage on the memory cell (101) during an operation to read the memory cell. For example, the voltage rises according to the profile segment (111) to segment (118) illustrated in FIG. 2.

At block 165, a current sensor (107) connected to the memory cell (101) determines whether or not at least a predetermined level of current (121) is presented in the memory cell (101).

At block 167, a bleed circuit (105) connected to the voltage driver (103) activates at least during a time period (e.g., between Tp and Tq in FIG. 2) in which the current sensor (107) operates to determine whether or not at least the predetermined level of current (121) is presented in the memory cell (101).

For example, the bleed circuit (105) can include a current mirror, or a switch connected to a capacitor, or any combination thereof. The bleed circuit (105) can be activated via operating the switch in accordance with operation timing (e.g., Tp) of the current sensor (107).

For example, the bleed circuit (105) can be activated by closing the switch at time Tb illustrated in FIG. 2, after the current sensor (107) is activated at time Tp in FIG. 2 to determine whether or not at least the predetermined level of current (121) is presented in the memory cell (101).

After the bleed circuit (105) is activated, the bleed circuit (105) can be deactivated by opening the switch after the current sensor (107) is deactivated at time Tq in FIG. 2, and/or at an end of the operation to read the memory cell (101).

Optionally, the bleed circuit (105) can be activated at a predetermined time interval (Tb to Tp in FIG. 2) after the current sensor (107) is activated to determine whether or not at least the predetermined level of current (121) is presented in the memory cell (101).

The present disclosure includes methods and apparatuses which perform the methods described above, including data processing systems which perform these methods, and computer readable media containing instructions which when executed on data processing systems cause the systems to perform these methods.

The memory device of FIG. 3 can be used in a data processing system.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An integrated circuit memory device, comprising:
   a memory cell;
   a current sensor connected to the memory cell;
   a voltage driver connected to the memory cell; and
   a bleed circuit connected to the voltage driver;
   wherein during an operation to read the memory cell, the voltage driver drives a voltage applied on the memory cell;
   wherein the bleed circuit is activated to reduce the voltage during a time period in which the current sensor operates to determine whether or not at least a predetermined level of current is presented in the memory cell;
   wherein the bleed circuit is activated after the current sensor is activated to determine whether or not at least the predetermined level of current is presented in the memory cell.

2. The integrated circuit memory device of claim 1, wherein the bleed circuit includes a current mirror, or a switch connected to a capacitor, or any combination thereof.

3. The integrated circuit memory device of claim 2, wherein the bleed circuit is activated in accordance with operation timing of the current sensor.

4. The integrated circuit memory device of claim 1, wherein after the bleed circuit is activated, the bleed circuit is deactivated at an end of the operation to read the memory cell.

5. The integrated circuit memory device of claim 1, wherein the bleed circuit is activated at a predetermined time interval after the current sensor is activated to determine whether or not at least the predetermined level of current is presented in the memory cell.

6. The integrated circuit memory device of claim 5, comprising:
   cross point memory containing the memory cell.

7. The integrated circuit memory device of claim 6, wherein the memory cell includes a select device.

8. The integrated circuit memory device of claim 7, wherein the memory device has no phase-change memory device.

9. The integrated circuit memory device of claim 8, wherein the memory device is programmable to store data via applying pulses with opposite polarity.

10. The integrated circuit memory device of claim 9, wherein during the operation to read the memory cell, the voltage driver drives the voltage according to a predetermined, fixed polarity.

11. A method, comprising:
    connecting a voltage driver to a memory cell in an integrated circuit memory device;
    driving, by the voltage driver, a voltage on the memory cell during an operation to read the memory cell;
    determining, by a current sensor connected to the memory cell, whether or not at least a predetermined level of current is presented in the memory cell; and
    activating of a bleed circuit connected to the voltage driver during a time period in which the current sensor operates to determine whether or not at least the predetermined level of current is presented in the memory cell, wherein the activating of the bleed circuit is after the current sensor starts to determine whether or not at least the predetermined level of current is presented in the memory cell.

12. The method of claim 11, wherein the activating of the bleed circuit is in accordance with operation timing of the current sensor.

13. The method of claim 11, wherein the bleed circuit remains activated when the current sensor completes determination of whether or not at least the predetermined level of current is presented in the memory cell.

14. The method of claim 11, wherein the activating of the bleed circuit starts at a predetermined time interval after the current sensor starts to determine whether or not at least the predetermined level of current is presented in the memory cell.

15. A memory device, comprising:
    a controller;
    a first set of parallel wires disposed in a first layer of an integrated circuit die;
    a second set of parallel wires disposed in a second layer of the integrated circuit die;
    a first set of voltage drivers connected to the first set of parallel wires respectively;
    a second set of voltage drivers connected to the second set of parallel wires respectively;
    an array of memory cells formed between the first layer and the second layer, wherein each respective memory cell is at a cross point of a wire in the first layer and a wire in the second layer; and
    a current sensor configured to determine whether or not the respective memory cell becomes conductive during an operation to read the respective memory cell;
    wherein during the operation to read the respective memory cell, at least one voltage driver in the first and second sets of voltage drivers has a bleed circuit that is activated, after the current sensor is activated to determine whether or not at least a predetermined level of current is presented in the memory, during determination of whether or not the respective memory cell becomes conductive cell.

16. The memory device of claim 15, wherein the respective memory cell has a select device.

17. The memory device of claim 15, wherein the respective memory cell has no phase-change memory device.

* * * * *